(12) United States Patent
Shiozawa

(10) Patent No.: US 6,636,295 B2
(45) Date of Patent: Oct. 21, 2003

(54) EXPOSURE APPARATUS AND DEVICE MANUFACTURING METHOD

(75) Inventor: Takahisa Shiozawa, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/820,622

(22) Filed: Mar. 30, 2001

(65) Prior Publication Data

US 2001/0052968 A1 Dec. 20, 2001

(30) Foreign Application Priority Data

Mar. 31, 2000 (JP) ........................................ 2000-097068

(51) Int. Cl.⁷ .............................................. G03B 27/42
(52) U.S. Cl. ............................ 355/67; 355/71; 359/494
(58) Field of Search ...................... 355/43, 53, 67–71; 250/492.1, 492.2; 359/246, 260, 483, 494; 372/57

(56) References Cited

U.S. PATENT DOCUMENTS

| | | | |
|---|---|---|---|
| 4,974,919 A | 12/1990 | Muraki et al. | 350/6.6 |
| 5,253,110 A * | 10/1993 | Ichihara et al. | 355/53 |
| 5,345,292 A | 9/1994 | Shiozawa et al. | 355/67 |
| 5,459,547 A | 10/1995 | Shiozawa | 355/67 |
| 5,475,491 A | 12/1995 | Shiozawa | 356/394 |
| 5,621,499 A | 4/1997 | Shiozawa | 355/67 |
| 5,684,567 A | 11/1997 | Shiozawa | 355/67 |
| 5,719,617 A | 2/1998 | Takahashi et al. | 347/241 |
| 6,238,063 B1 * | 5/2001 | Tanitsu et al. | 359/629 |
| 6,246,526 B1 * | 6/2001 | Okuyama | 349/5 |
| 6,466,303 B1 * | 10/2002 | Omura et al. | 355/67 |
| 2002/0101900 A1 * | 8/2002 | Govorkov et al. | 372/57 |
| 2002/0114362 A1 * | 8/2002 | Volger et al. | 372/32 |

FOREIGN PATENT DOCUMENTS

| | | |
|---|---|---|
| JP | 60-243604 | 12/1985 |
| JP | 3-225914 | 10/1991 |
| JP | 2744274 | 4/1998 |

* cited by examiner

Primary Examiner—D Rutledge
(74) Attorney, Agent, or Firm—Fitzpatrick, Cella, Harper & Scinto

(57) ABSTRACT

An illumination system for lithography includes an optical system for projecting light from a laser onto a mask. The optical system includes a birefringent element being effective to dissolve polarization of light from the laser. The birefringent element is made of $CaF_2$.

14 Claims, 8 Drawing Sheets

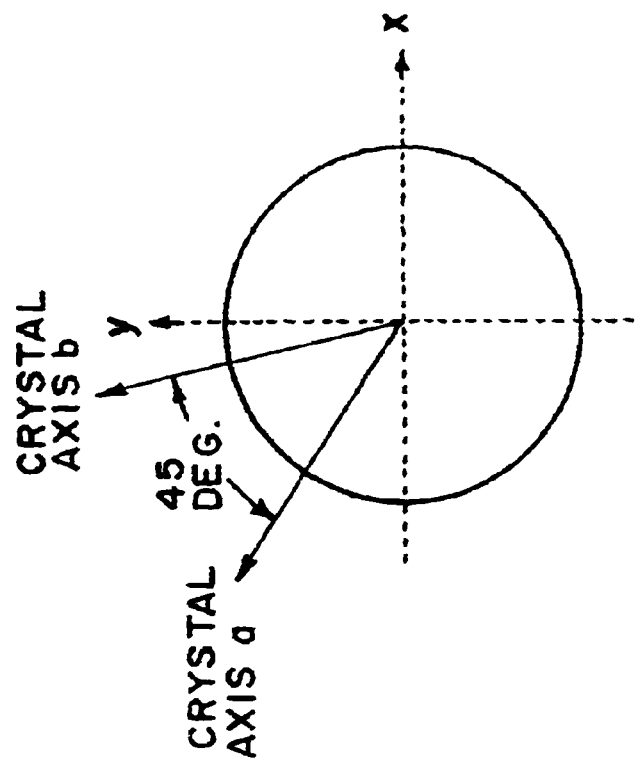
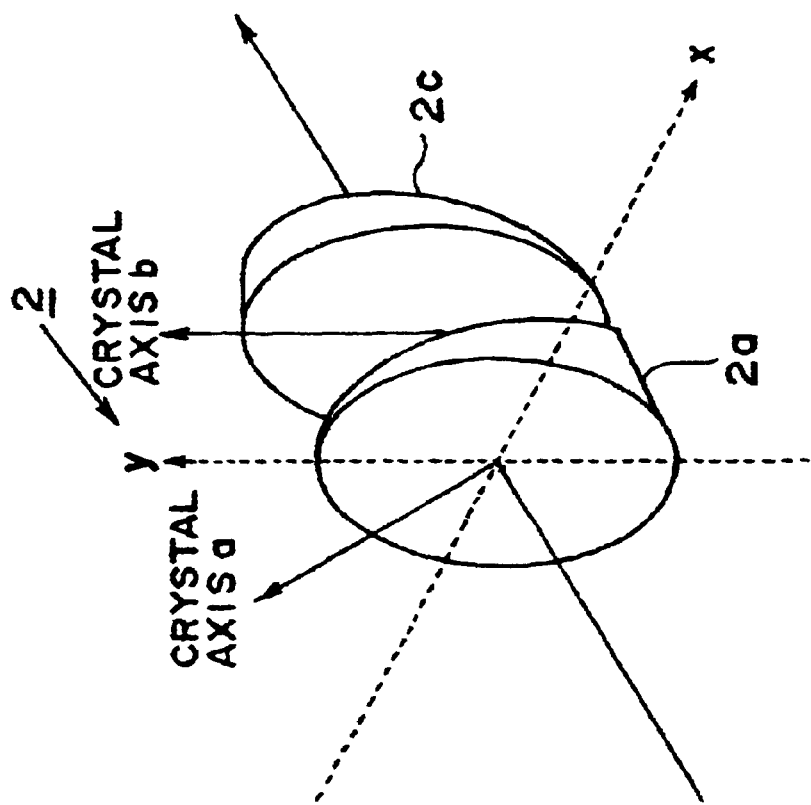

EXPOSURE APPARATUS AND DEVICE MANUFACTURING METHOD

FIELD OF THE INVENTION AND RELATED ART

This invention relates to an exposure apparatus and, more particularly, to an exposure apparatus for use in the manufacture of devices such as semiconductor devices (e.g., IC's or LSI's), image pickup devices (e.g., CCD's), display devices (e.g., liquid crystal panels), or magnetic heads, for example.

In projection exposure apparatus for the manufacture of semiconductor devices such as IC's or LSI's, increases in density (integration) of a semiconductor device have required an extraordinarily high optical performance of an exposure apparatus to assure a smallest linewidth of 0.2 micron on a wafer surface.

Generally, when a circuit pattern of a reticle is projected by a projection optical system onto a wafer surface (projection plane being equivalent to an image plane). the resolvable linewidth of the circuit pattern is largely influenced by the wavelength ($\lambda$) of exposure light and the numerical aperture (NA) of the projection optical system as well as the quality of uniformness of an illuminance distribution upon the projection plane.

Particularly, when the smallest linewidth is on an order of 0.2 micron or less, a suitable light source for exposure will be a KrF excimer laser ($\lambda$=193 nm). As regards the uniformness of an illuminance distribution on a projection plane in an exposure apparatus using such a laser light source, it should desirably be about 1% or less.

FIG. 8 is a schematic view of a main portion of an optical system of a projection exposure apparatus.

In the drawing, a laser light beam (pulse light) from an excimer laser 1 is transformed by a beam shaping optical system 3 into a desired shape, and it is then incident on a light entrance surface of an optical integrator 4 having small lenses arrayed two-dimensionally. The light is divided and collected by the optical integrator, whereby a plurality of secondary light sources are produced adjacent to a light exit surface of the optical integrator 4. Divergent light beams from these secondary light sources, defined adjacent to the light exit surface of the integrator, are collected by a condenser lens 6, such that they are superposed one upon another to illuminate an aperture of a field stop 9 which is disposed at a position optically conjugate with the circuit pattern surface of the reticle 12 placed on the surface to be illuminated.

Light beams from the field stop 9 are directed by way of a lens 10a, a deflecting mirror 11, and a lens 10b, to illuminate the same region (circuit pattern) of the reticle 12. The lenses 10a and 10b cooperate to define an imaging lens system, and they function to project an image of the aperture of the stop 9, having a uniform light intensity distribution, onto the circuit pattern of the reticle 12.

The thus illuminated circuit pattern of the reticle 12 is projected, in a reduced scale, by a projection optical system 13 onto a wafer 15 which is held on an X-Y-Z stage 16. With this procedure. a resist applied to the wafer 15 surface is exposed with a reduced image of the circuit pattern. The X-Y-Z stage 16 is movable in an optical axis direction (Z) and in two directions (x and y) orthogonal thereto. The optical system 13 comprises lens systems 13a and 13b, and an aperture stop 14 between the lens systems 13a and 13b.

This aperture stop 14 functions to determine the position, shape and size (diameter) of the pupil of the optical system 13.

Denoted at 5 is an aperture stop of an illumination optical system, and it has an aperture having a function for determining the size and shape of an effective light source which comprises the above-described secondary light sources The aperture of this aperture stop 5 is imaged by an imaging optical system, comprising lenses 6, 10a, 10b and 13a, upon the aperture of the aperture stop 14, namely, upon the pupil plane.

Denoted at 7 is a beam splitter which comprises a glass plate with or without a dielectric film formed thereon. The glass plate 7 is disposed obliquely with respect to the optical axis, between the lens 6 and the field stop, and it functions to reflect a portion of each of the plural light beams from the integrator 4, toward a light quantity detecting means 8. On the basis of the light quantities of each of the pulse lights as detected by the light quantity detecting means 8, the light quantities of pulse lights sequentially impinging on the wafer 15 surface are detected. By using the thus obtained light quantity data, the exposure amount of the resist on the wafer 15 is controlled.

Denoted at 101 is a quarter waveplate which is a birefringent plate having its crystal axis tilted by 45 deg. with respect to the polarization direction (y direction) of linearly polarized light from the excimer laser 1. It functions to convert the linear polarization of this laser light into circular polarization.

It has been considered that, once an optical system such as shown in FIG. 8 is assembled, even if the polarization direction of the laser light from the excimer laser 1 shifts slightly, owing to the polarization conversion function of the quarter waveplate 101, the glass plate 7 can be continuously irradiated with approximately circularly polarized light in which a polarization component of laser light (P-polarized light) parallel to the sheet of the drawing and a polarization component (S-polarized light) perpendicular to the sheet of the drawing have approximately the same intensities, such that the light quantity ratio between the light (exposure light for wafer 15) passed through the glass plate 7 and the light (to be detected by the light quantity detecting means 8) reflected by the glass plate 7 can be maintained substantially constant.

FIGS. 10A and 10B illustrate the practical assembling procedure for the integrator 4. FIG. 10A is a sectional view of the integrator 4 along a section containing the optical axis. FIG. 10B is a sectional view of the integrator, along a section perpendicular to the optical axis. As shown in FIG. 10A, the integrator 4 is an aggregation of bar lenses each having convex spherical surfaces at opposite ends thereof. Also, as shown in FIG. 10B, the bar lenses having spherical surfaces at their opposite ends are accumulated and then, by pressing them in two directions, they are bonded and secured, whereby the integrator 4 is assembled.

In this assembling procedure, each bar lens of the integrator 4 may be distorted as forces are applied thereto in radial directions. Thus, these bar lenses may have different birefringent properties. Additionally, even inside each bar lens, the birefringence may differ in dependence upon the position. For these reasons, in the structure of FIG. 8, there is a possibility that, even if the laser light as it enters the integrator 4 is circularly polarized light, the light as it emerges from the integrator 4 is not circularly polarized light. Also, light beams emitted from the bar lenses may be in different polarization states.

This raises a problem that, in the structure of FIG. 8, due to a change in polarization direction of the linearly polarized laser light from the excimer laser 1 and to the polarization dependency of the reflection factor (transmission factor) of the glass plate 7 (beam splitter), the light quantity ratio between the light (exposure light for wafer 15) passed through the glass plate 7 and the light (to be received by detecting means 8) reflected by the glass plate 7 cannot be maintained constant in a required range, such that precise exposure control cannot be done stably.

The light entrance surface of each bar lens is optically conjugate with the wafer 15 surface. Because these bar lenses may have different birefringent properties, due to the polarization light transmission characteristic of the glass plate 7 or the mirror 11, there may occur illuminance non-uniformess. Further, if the polarization state of the laser light or the birefringence of each bar lens or each optical system changes with the progress of the exposure process, the illuminance non-uniformess to be produced may vary. These problems still remain even if a quarter waveplate is replaced by a simple depolarization plate.

SUMMARY OF THE INVENTION

It is accordingly an object of the present invention to provide an improved exposure apparatus by which at least one of the problems described above can be removed or reduced.

In accordance with an aspect of the present invention, to achieve the above-described object, there is provided an exposure apparatus for illuminating a mask with a plurality of light beams produced by use of light from a laser, and for exposing a substrate with a pattern of the mask, characterized by means for substantially depolarizing or canceling polarization of the light beams.

In accordance with another aspect of the present invention, there is provided an exposure apparatus for exposing a substrate with a pattern of a mask, characterized in that polarized light from a light source is transformed into light having its polarization state, in a section perpendicular to an optical axis, changed, that the light is divided with respect to a wavefront into plural light beams which are then superposed one upon another on a light entrance surface of an optical integrator, and that the mask is illuminated with light beams from the optical integrator.

In accordance with a further aspect of the present invention, there is provided an exposure apparatus for exposing a substrate with a pattern of a mask, comprising: depolarization means for cancelling polarization of polarized light from a light source; a first optical system for wavefront-dividing light from said depolarization means into plural light beams and for superposing them one upon another on a light entrance surface of an optical integrator; and a second optical system for illuminating the mask with light beams from said optical integrator.

In an exposure apparatus according to this aspect of the invention, the apparatus may comprise a light quantity detecting beam splitter (glass plate) or a light path changing deflection mirror, disposed at the light exit side of the optical integrator (the side remote from the laser). The light from the depolarization means is wavefront-divide into plural light beams and they are superposed one upon another on the light entrance surface of the optical integrator. Therefore, the light beams from the optical integrator are sufficiently depolarized.

In accordance with a yet further aspect of the present invention, there is provided an exposure apparatus for exposing a substrate with a pattern of a mask, comprising: polarization converting means for converting polarization of a polarized light from a light source into one of circular polarization or elliptical polarization; a first optical system for wavefront-dividing light from said polarization converting means into plural light beams and for superposing them one upon another on a light entrance surface of an optical integrator; and a second optical system for illuminating the mask with light beams from said optical integrator.

In an exposure apparatus according to this aspect of the invention, similarly, the apparatus may comprise a light quantity detecting beam splitter (glass plate) or a light path changing deflection mirror, disposed at the light exit side of the optical integrator (the side remote from the laser). The light from the depolarization means is wavefront-divided into plural light beams and they are superposed one upon another on the light entrance surface of the optical integrator. Therefore, the light beams from the optical integrator are sufficiently depolarized. However, the advantageous effects of this exposure apparatus may be inferior to those of the preceding embodiments.

In accordance with a still further aspect of the present invention, there is provided a device manufacturing method, comprising the steps of: exposing a wafer with a device pattern by use of an exposure apparatus as recited above; and developing the exposure wafer.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 5A and 5B are schematic views for explaining a modified example of a depolarization unit.

DESCRIPTION OF THE PREFERRED EMBODIMENTS

Figure 1:
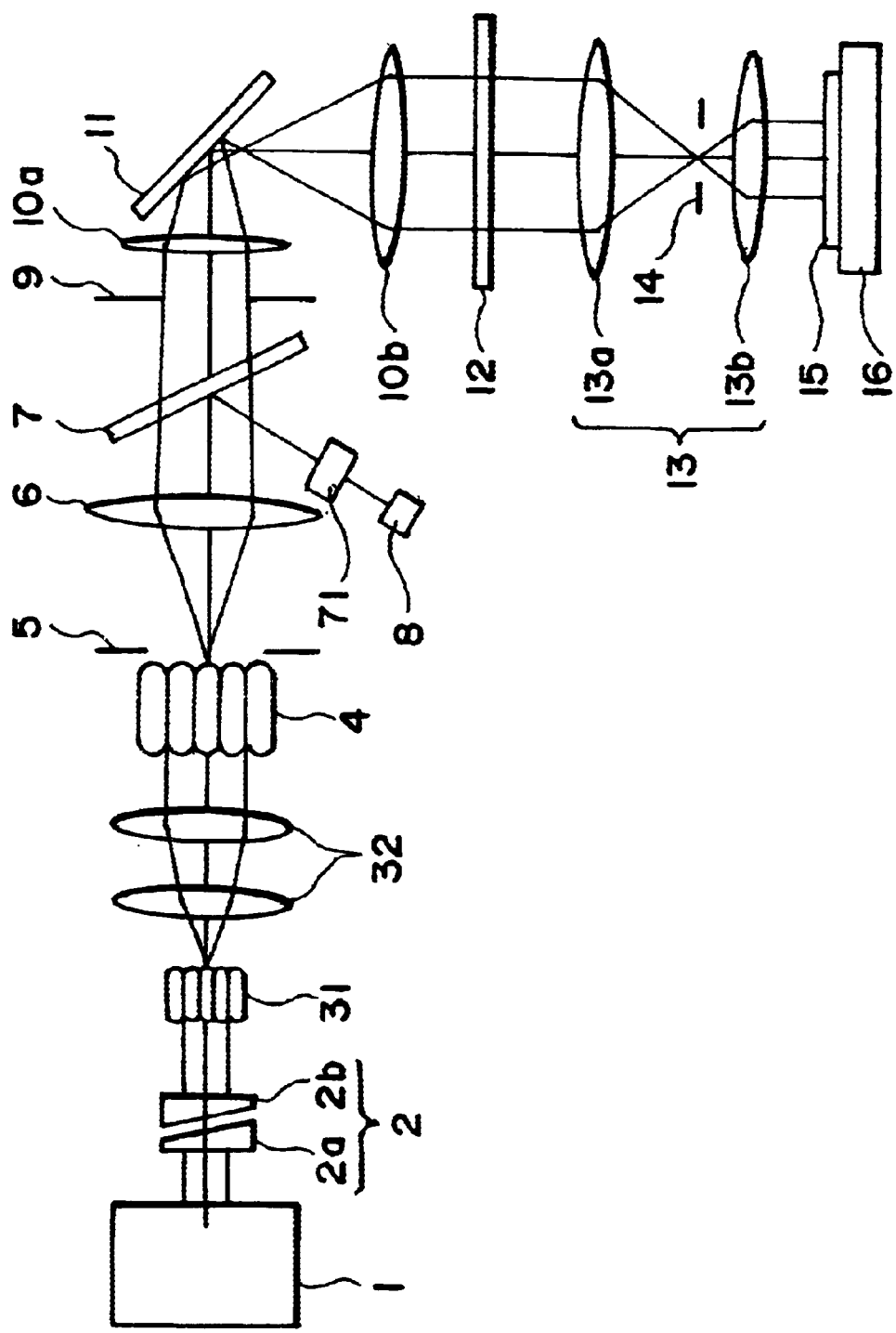
FIG. 1 is a schematic view of a main portion of an exposure apparatus according to a first embodiment of the present invention.
Figure 8:
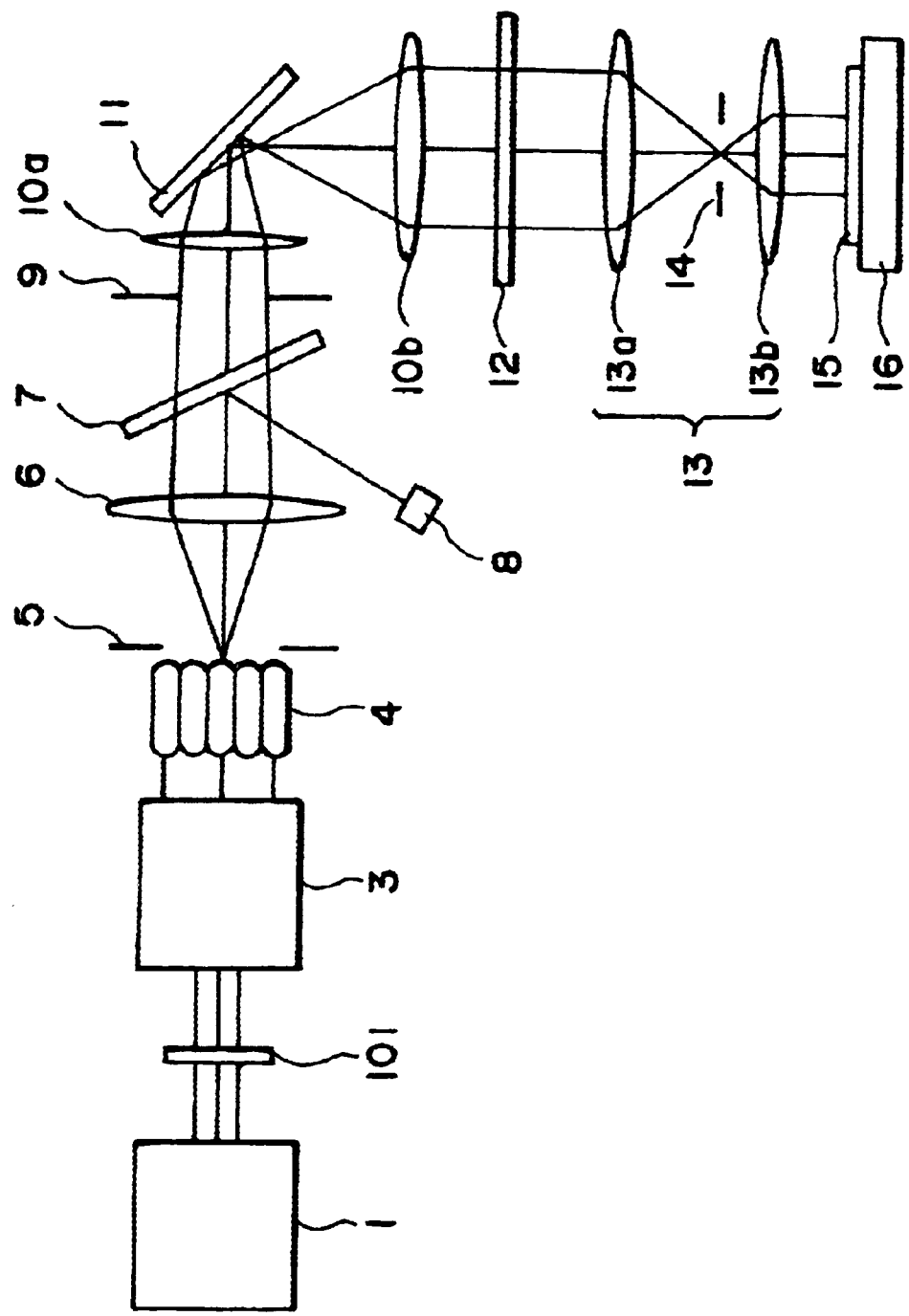
FIG. 8 is a schematic view of a main portion of a conventional exposure apparatus.
Figure 9:
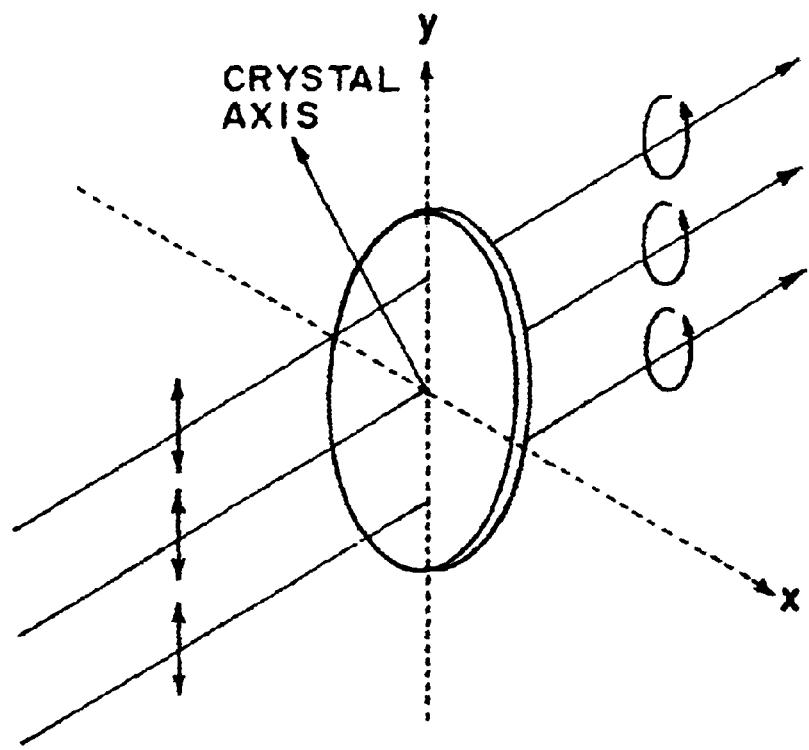
FIG. 9 is a schematic view for explaining the function of a quarter waveplate in FIG. 8.
Figure 10A:
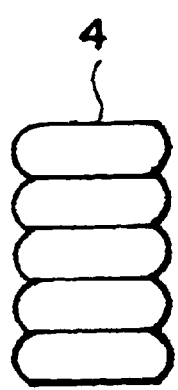
FIGS. 10A and 10B are schematic views for explaining a fly's eye lens assembling procedure.
Figure 10B:
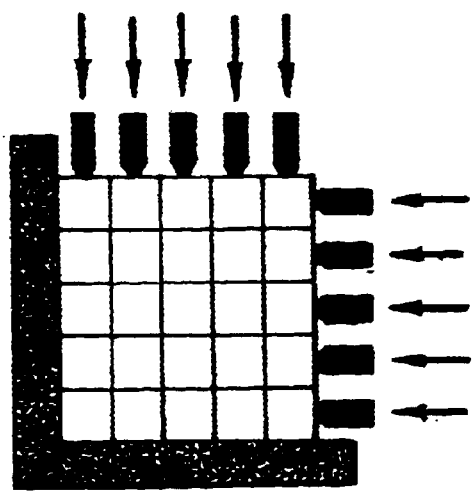

FIG. 1 is a schematic view of a first embodiment of the present invention. The apparatus shown in FIG. 1 has improvements over the structure shown in FIG. 8, and similar reference numerals are assigned to elements corresponding to those of FIG. 8. The apparatus shown in FIG. 1 is a projection exposure apparatus for projecting a reduced image of a device pattern of a mask (reticle) onto different shot regions on a wafer sequentially in accordance with a step-and-repeat method or step-and-scan method. In device manufacturing processes based on lithography, a wafer having its shots (resist thereon) exposed with a device pattern by use of the exposure apparatus of FIG. 1 is developed by use of a developing liquid, whereby a resist mask is formed. Then, by using this resist mask, an etching process is carried out.

Denoted in FIG. 1 at 1 is an excimer laser for producing ultraviolet laser light being linearly polarized or being polarized separately. The laser 1 may comprise a KrF excimer laser with an emission wavelength of about 248 nm, an ArF excimer laser with emission wavelength of about 193 nm, or an $F_2$ laser with an emission wavelength of about 157 nm, for example. By means of band-narrowing made through a spectral element such as a diffracting grating disposed inside an oscillator (resonator), it has an emission spectrum of a half bandwidth about 1 pm or being narrower than 1 pm.

Denoted at 2 is a depolarization unit. Denoted at 2a is a depolarization plate having a wedge-like shape in a section containing the optical axis. It is made of a transparent material having a birefringence. Denoted at 2b is a transparent member having a wedge-like shape in a section containing the optical axis, for correcting the direction of the optical axis being changeable due to the influence of the wedge shape of the depolarization plate 2a. The transparent member 2b is made of a material having no birefringence.

Figure 2A:
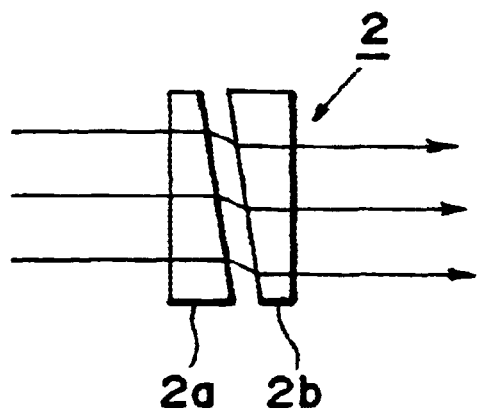
FIGS. 2A and 2B are schematic views for explaining examples of a depolarization unit.
Figure 2B:
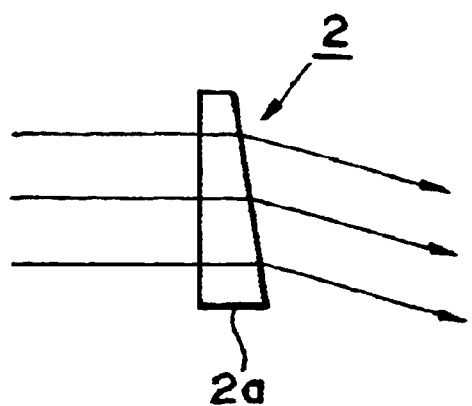

As shown in FIG. 2B, an embodiment without having a wedge-shaped transparent member 2b is possible. On that occasion, the optical axis (laser light) deflected by the depolarization plate 2a and the optical axis of the optical system following it should be registered with each other.

Figure 3:
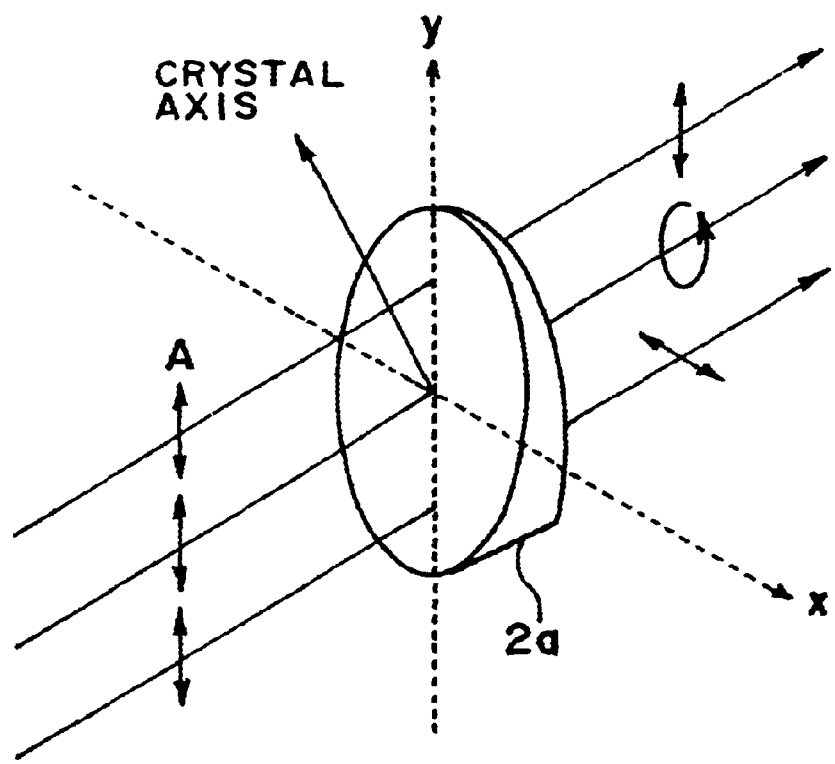
FIG. 3 is a schematic view for explaining the function of a depolarization plate.
Figure 4:
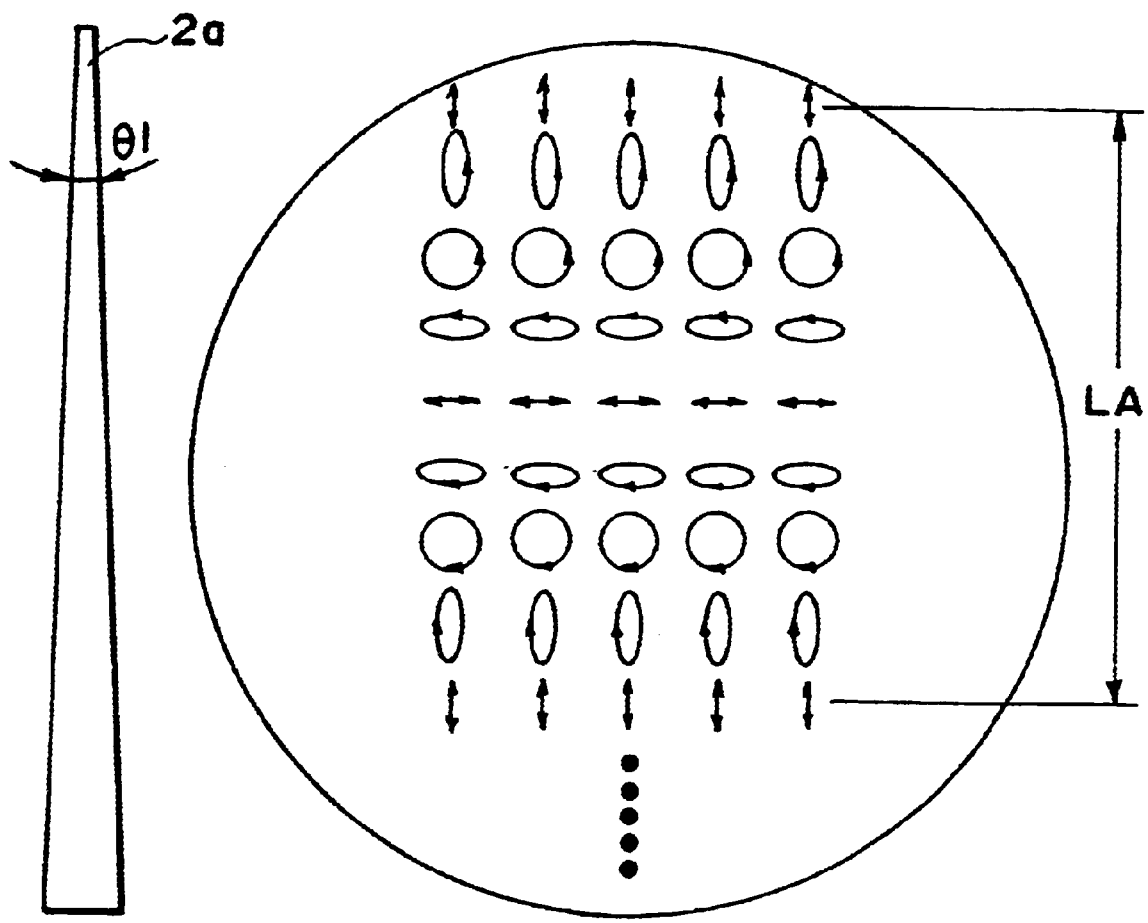
FIG. 4 is a schematic view for explaining a depolarization plate in a section containing an optical axis, as well as the depolarization made by it.

FIG. 3 shows the structure of the depolarization plate 2a, and FIG. 4 illustrates the function thereof. As shown in FIG. 3, the direction of the crystal axis of the depolarization plate 2a defines a certain angle (e.g., 45 deg.) with respect to the polarization direction (y-direction) of the linearly polarized light from the excimer laser 1. The thickness of the depolarization plate is determined so that the light ray (linearly polarized in the y-direction) passing through the central position thereof, as passed through the optical axis, is converted into circularly polarized light.

Here, it should be noted that the light ray passing through the center of the depolarization plate 2a should not always be converted into circularly polarized light. What is required here is that the polarization state of the light beam incident on the depolarization plate 2a is changed continuously or step by step so that, in the light as a whole, polarization is cancelled and it is placed substantially in a non-polarized state.

In the first embodiment, the light beam emitted from the depolarization plate 2a has its polarization state changed along the y direction, as depicted by arrows in the front view at the right-hand side portion of FIG. 4. More specifically, in FIG. 4, within the range LA, the polarization stage changes continuously, from the above, in an order that "y-direction linear polarization", "counterclockwise elliptical polarization", "counterclockwise circular polarization", "counterclockwise elliptical polarization", "x-direction linear polarization", "clockwise elliptical polarization", "clockwise circular polarization", "clockwise elliptical polarization", and then "y-direction linear polarization".

Such changes of polarization state within the range LA are repeated along the y direction.

The number of repetitions is determined in dependence upon the wedge angle θ1 and the thickness of the depolarization plate 2a and the beam diameter of the laser light. The wedge angle θ1 and the thickness are determined in accordance with the degree of depolarization required. For a sufficient depolarization effect, preferably five repetitions or more may be done.

As described above, the depolarization plate 2a functions to convert linearly polarized laser light incident thereon into light whose polarization state changes continuously or step by step within a section orthogonal to the optical axis, to thereby cancel the polarization.

As regards the structure and function of such depolarization plate, reference may be made to Japanese Published Patent Application, Publication No. 46802/1991.

The laser light thus depolarized by the depolarization unit 2 enters a first fly's eye lens 31. The fly's eye lens 31 is similarly an optical integrator, and it cooperates with a lens system 32 to illuminate another optical integrator (second fly's eye lens) 4 with a uniform illuminance distribution.

Here, the laser light depolarized by the depolarization unit 2 is divided, with respect to the wavefront, by the fly's eye lens 31, and a plurality of light beams having different polarization states emit from the fly's eye lens 31. These light beams having different polarization states are then superposed one upon another by the lens system 32 on the light entrance surface of the optical integrator 4. Thus, the laser beams entering each portion (bar lenses) of the optical integrator 4 have been sufficiently depolarized, and they are in the same polarization state.

Therefore, plural laser beams emitted from the optical integrator 4, that is, plural secondary light sources, are well depolarized, and they are in the same polarization state.

In accordance with this embodiment, the optical system is so arranged that plural laser beams each being well depolarized are emitted from plural secondary light sources, respectively. With this arrangement, even if the polarization state of laser light from the excimer laser, being linearly polarized or being polarized separately, changes, the polarization state of each of the light beams from the secondary light sources does not change or changes little as compared with a conventional structure.

Conventionally, as described hereinbefore, there is a problem that the light quantity ratio between the light passing through the glass plate 7 and the light reflected thereby cannot be maintained constant, due to the polarization dependency of the reflection factor (transmission factor) of the glass plate 7 (beam splitter), such that precise control of the exposure amount based on the light quantity detecting means 8 is difficult to accomplish. Also, there is a problem that, due to the polarization dependency of the reflection factor of the deflecting mirror 11, non-uniformess of illuminance or non-uniform exposure is produced. Further, due to a change in polarization state of the laser light or a change in birefringence of a lens, non-uniformess of illuminance or non-uniform exposure is produced. This embodiment can remove or reduce these problems.

In FIG. 1, denoted at 71 is a parallel flat plate which is disposed with a tilt with respect to the optical axis, as viewed in the sheet of the drawing and including the optical axis as bent by the glass plate 7. It has a function for reducing a detection error of exposure amount based on the polarization dependency of the reflection factor (transmission factor) of the glass plate 7. As regards the exposure amount detection error reducing technology based on the parallel flat plate 71, reference may be made to Japanese Patent No. 2744274 issued Apr. 28, 1998 or corresponding U.S. Pat. No. 5,475, 491.

In this embodiment and embodiments to be described later, when the transmission factor and the reflection factor of the glass plate (beam splitter) 7 with respect to the P-polarized component are T1P and R1P, respectively, while the transmission factor and the reflection factor of the glass plate with respect to the S-polarized component are T1S and R1S, respectively, and also the transmission factors of the parallel flat plate 71 with respect to the P-polarized component and the S-polarized component are T2P and R2S, respectively, the structure is arranged so as to satisfy the following relation:

$$T2P/T2S=(T1P \times R1S)/(T1S \times R1P)$$

With this arrangement, even if the state of polarization of the polarized light from the excimer laser 1 changes slightly, the P-polarized component and S-polarized component of the light reflected by the glass plate 7 and detected by the light quantity detecting means 8 and the P-polarized component and the S-polarized component of the light passed through the glass plate 7 can be maintained substantially at the same intensity ratio.

Use of the parallel flat plate 71 described above, in addition to superposing plural light beams of different polarization states one upon another on the light entrance surface of the optical integrator 4, made through the depolarization unit, the optical integrator 31 and the lens system 32, makes it more sure to solve the problem resulting from the change in polarization state of the laser light.

However, in an embodiment of the present invention, the parallel flat plate 71 may be omitted.

Referring back to FIG. 1, the light beams each being well depolarized and emitted from the field stop 9 are directed by way of a lens 10a, a deflecting mirror 11 and a lens 10b to illuminate the same region (circuit pattern) on the reticle 12. The lenses 10a and 10b cooperate to define an imaging lens system, and they function to project an image of the aperture of the stop 9, having a uniform light intensity distribution, onto the circuit pattern of the reticle 12.

The thus illuminated circuit pattern of the reticle 12 is projected, in a reduced scale, by a projection optical system 13 onto a wafer 15 which is held on an X-Y-Z stage 16. With this procedure, a resist applied to the wafer 15 surface is exposed with a reduced image of the circuit pattern. The X-Y-Z stage 16 is movable in an optical axis direction (Z) and in two directions (x and y) orthogonal thereto. The optical system 13 comprises lens systems 13a and 13b, and an aperture stop 14 between the lens systems 13a and 13b. This aperture stop 14 functions to determine the position, shape and size (diameter) of the pupil of the optical system 13.

Denoted at 5 is an aperture stop of an illumination optical system, and it has an aperture having a function for determining the size and shape of an effective light source which comprises the above-described secondary light sources. The aperture of this aperture stop 5 is imaged by an imaging optical system, comprising lenses 6, 10a, 10b and 13a, upon the aperture of the aperture stop 14, namely, upon the pupil plane.

Denoted at 7 is a beam splitter which comprises a glass plate with or without a dielectric film formed thereon. The glass plate 7 is disposed obliquely with respect to the optical axis, between the lens 6 and the field stop, and it functions to reflect a portion of each of the plural light beams from the integrator 4, toward a light quantity detecting means 8.

On the basis of the light quantities of each of the pulse lights as detected by the light quantity detecting mean 8, the light quantities of pulse lights sequentially impinging on the wafer 15 surface are detected. By using the thus obtained light quantity data, the exposure amount of the resist on the wafer 15 is controlled.

The projection optical system 13 is an optical system which is telecentric on both of the mask (reticle) 12 side and the wafer 15 side or, alternatively, only on the wafer 15 side. It projects a pattern of the mark 12 onto a wafer in a reduced scale. As illustrated, the optical system 13 is a dioptric system comprising lens systems 13a and 13b and an aperture stop 14 with a variable aperture diameter, or a catadioptric system comprising a concave mirror and a lens in place of both of or one of the lens systems 13a and 13b.

When the excimer laser 1 is an $F_2$ excimer laser having an emission wavelength of 157 nm, the optical system may be placed in a helium ambience, by which attenuation of the laser intensity can be prevented.

When an $F_2$ laser is used as an exposure light source and if the projection optical system 13 is a dioptric system, plural lenses may desirably be made of different materials having different Abbe constants, or alternatively, a diffractive optical element having a positive focal distance and having a dispersion inverse to a lens may preferably be used in combination with the lenses. Further, the projection optical system 13 may effectively be a catadioptric system of a type wherein an intermediate image is formed or a type in which no intermediate image is formed.

As regards materials for the lenses 6, 10a, 10b, 13a, 13b and 32, the transparent wedge 2b, the glass plates 7, 11 and 71 and the mask 12 substrate, fused composite quartz, fluorine doped composite quartz, or fluorite may be used. As regards the material for the depolarization plate 2a, a birefringence crystal such as a berg crystal, for example, may be used in a case when the excimer laser 1 is a KrF excimer laser or an ArF excimer laser. If the excimer laser 1 is an $F_2$ excimer laser, an element made of $CaF_2$, for example, having a high transmission factor to the light of a wavelength 157 nm may be used and, by applying distortion thereto, a birefringence property may be created therein.

FIGS. 5A and 5B show a modified example of the depolarization unit 2a. In the drawings, denoted at 2a and 2c are depolarization plates. These plates have wedge-like shapes with tilts in opposite directions, with respect to a section containing the optical axis and the y axis. The crystal axis "a" of the depolarization plate 2a has a predetermined angle with respect to the y axis which is a reference polarization direction of the linearly polarized light from the excimer laser 1. The crystal axis b of the depolarization plate 2b has an angle 45 deg. with respect to the crystal axis of the depolarization plate 2a.

In a case wherein only one depolarization plate 2a is used in the depolarization unit 2 as shown in FIGS. 1–4, if the polarization direction of the linearly polarized laser light from the excimer laser 1 changes largely so that the polarization direction of the laser light becomes registered with or orthogonal to the crystal axis direction of the depolarization plate 2a, polarization of the laser light cannot be cancelled any more. However, in the depolarization unit shown in FIG. 5, a pair of depolarization plates 2a and 2b whose crystal axis directions define 45 deg. therebetween is used, the above-described problem can be avoided. Thus, cancellation of polarization of the laser beam from the excimer laser 1 is assured constantly.

Figure 6:
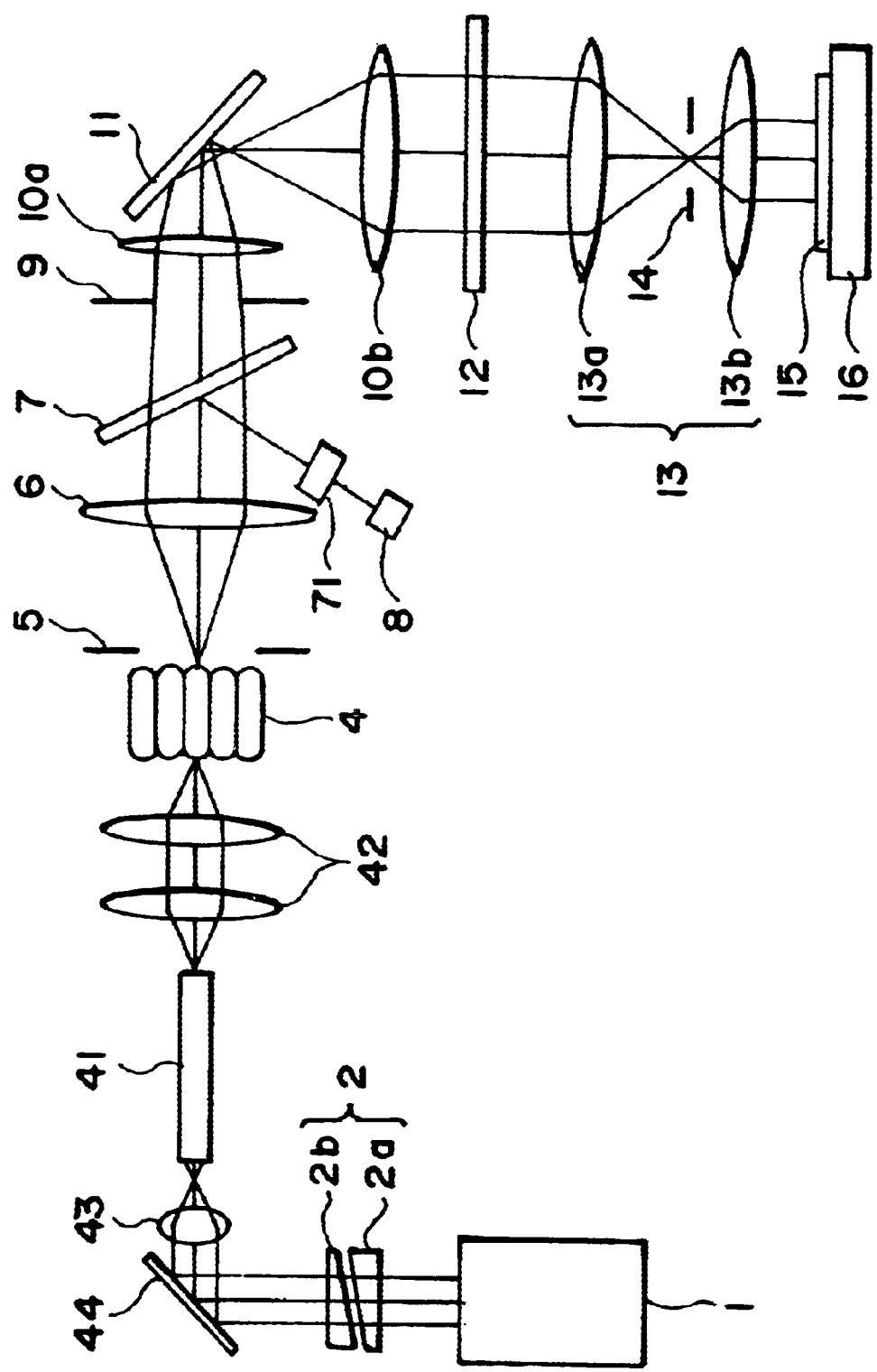
FIG. 6 is a schematic view of a main portion of an exposure apparatus according to a second embodiment of the present invention.

FIG. 6 is a schematic view of a second embodiment of the present invention. The same reference numerals as those of FIG. 1 are assigned to corresponding elements, and a description thereof is omitted.

The apparatus shown in FIG. 6 is a projection exposure apparatus for projecting a reduced image of a device pattern of a mask (reticle) onto different shot regions on a wafer sequentially in accordance with a step-and-repeat method or step-and-scan method. In device manufacturing processes based on lithography, a wafer having its shots (resist thereon) exposed with a device pattern by use of the exposure apparatus of FIG. 6 is developed by use of a developing liquid, whereby a resist mask is formed. Then, by using this resist mask, an etching process is carried out.

The exposure apparatus of FIG. 6 differs from that of FIG. 1 in the structure of an optical system between the depolarization unit 2 and the optical integrator 4.

In FIG. 6, the depolarized laser light from the depolarization unit 2 whose polarization state differs in dependence upon the position within the section (wavefront) orthogonal to the optical axis, is reflected by a deflecting mirror 44, and it is collected by a lens 43 upon a light entrance surface of an internal reflection type optical integrator 41. This optical integrator 41 may be called a rod-type integrator, and it comprises a glass rod having a polygonal shape in the section perpendicular to the optical axis or a kaleidoscope having mirrors disposed opposed to each other to define an internal reflection surface of polygonal shape in the section perpendicular to the optical axis.

The laser light entering the rod-type integrator 41 is divided into light not reflected by the inner surface (side face in the case of a glass rod) of the integrator 41 and the light reflected multiple times thereby, and these light beams reach the light exit surface of the integrator 41 while being superposed one upon another. Thus, a uniform light intensity distribution is produced at the light exit surface. Further, the light beams which reach the light exit surface, while being superposed one upon another, are the light group produced by dividing the wavefront of the laser light having been depolarized by the depolarization unit 2. This means that plural light beams having different polarization states are superposed one upon another on the light exit surface of the integrator 41. Thus, a substantially polarization-free state is accomplished.

The light exit surface of the rod type integrator 41 is imaged by a lens system 42 on the light entrance surface of the optical integrator 4. As a result, the laser beams entering each portion (bar lenses) of the integrator 4 are being sufficiently depolarized, and they have the same polarization state.

Consequently, plural laser beams emerging from the integrator 4, that is, plural secondary light sources, are being well depolarized and have the same polarization state. Thus, substantially the same advantageous results as attainable with the exposure apparatus of the first embodiment are obtainable.

Figure 7:
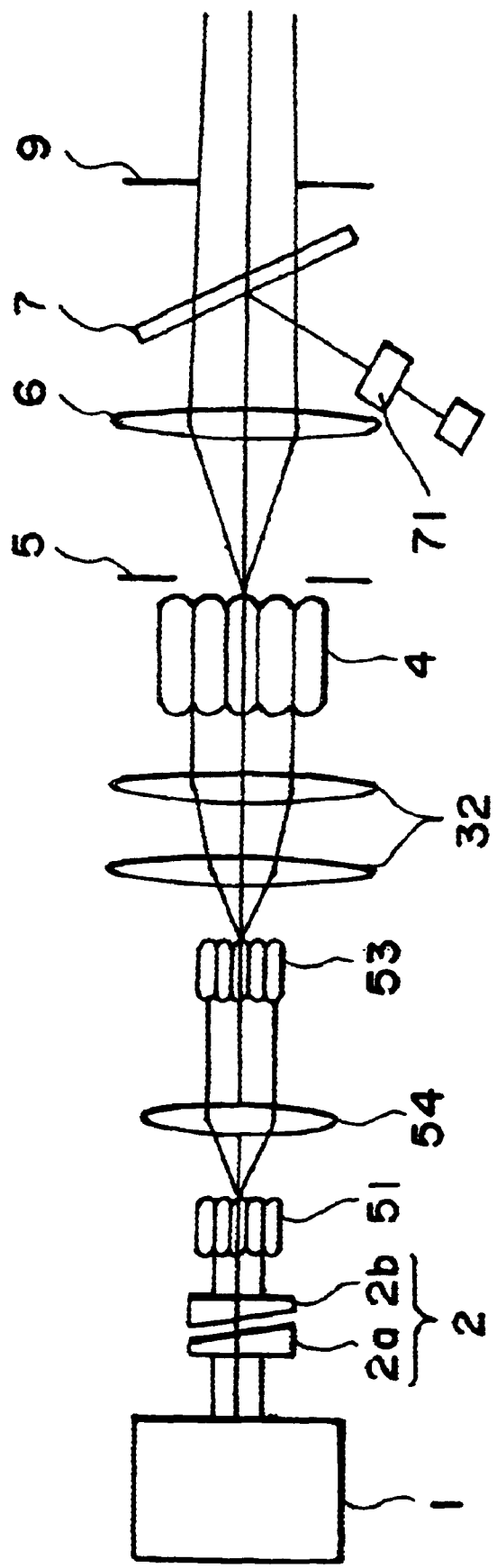
FIG. 7 is a schematic view of a main portion of an exposure apparatus according to a third embodiment of the present invention.

FIG. 7 is a schematic view of a third embodiment of the present invention. The same reference numerals as those of FIG. 1 are assigned to corresponding elements, and a description thereof is omitted. Further, the structure at the mask side of the field stop 9 is exactly the same as that of the embodiment of FIG. 1, and therefore, the illustration of the same is omitted.

The apparatus shown in FIG. 7 is a projection exposure apparatus for projecting a reduced image of a device pattern of a mask (reticle) onto different shot regions on a wafer sequentially in accordance with a step-and-repeat method or step-and-scan method. In device manufacturing processes based on lithography, a water having its shots (resist thereon) exposed with a device pattern by use to the exposure apparatus of FIG. 7 is developed by use of a developing liquid, whereby a resist mask is formed. Then, by using this resist mask, an etching process is carried out.

The exposure apparatus of FIG. 7 differs from that of FIG. 1 in the structure of an optical system between the depolarization unit 2 and the optical integrator 4.

In FIG. 7, the depolarized laser light from the depolarization unit 2 whose polarization state differs in dependence upon the position within the section (wavefront) orthogonal to the optical axis, is wavefront-divided by an optical integrator 51 (first fly's eye lens), such that plural light beams having different polarization states are emitted from the fly's eye lens 51. These light beams, having different polarization states, are superposed one upon another by a lens system 54, upon the light entrance surface of another optical integrator 53. Therefore, the light beams entering each portion (bar lenses) of the integrator 53 are being sufficiently depolarized, and they have the same polarization state.

The light beams from the integrator 53, being well depolarized and having the same polarization state, are again wavefront-divided by this optical integrator 53 (second fly's eye lens), whereby plural light beams are emitted from the fly's eye lens 53. These light beams are then superposed one upon another by a lens system 32, upon the light entrance surface of the optical integrator 4 (third fly's eye lens). Thus, the light beams entering each portion (bar lenses) of the integrator 4 are being fully depolarized, and they have the same polarization state more precisely.

Consequently, plural laser beams emerging from the integrator 4, that is, plural secondary light sources, are being fully depolarized and have the same polarization state more exactly. Thus, substantially the same advantageous results or more as attainable with the exposure apparatus of the first embodiment are obtainable.

Modifications having been described with reference to the first embodiment are similarly applicable also to the second and third embodiments of the present invention.

Further, in each embodiment, the optical integrator comprising a fly's eye lens may be replaced by a rod type integrator, or the rod type integrator may be replaced by a fly's eye lens integrator, with small modifications to the optical system. For example, without use of a fly's eye lens optical integrator, two or three (or more) rod type integrators may be disposed in a series. Alternatively, a fly's eye lens optical integrator and a rod type integrator may be disposed in order from the excimer laser side.

When an $F_2$ excimer laser is used as the laser 1, in order to decrease the loss of light quantity of the laser light, preferably, a relatively thin diffractive optical element may be used. As regards such a diffractive optical element, an element simply having the same function as that of a fly's eye lens, or a special element being provided with a wavefront dividing function like the former, as well as a control function for controlling the light intensity distribution or the sectional shape along the section perpendicular to the optical axis, may be used. Such a special element may be produced by a CGH (computer generated hologram).

Further, as regards the exposure light source, in place of using an excimer laser, a combination of a copper vapor laser or an argon gas laser and a secondary harmonics producing element, for producing deep ultraviolet rays, may be used.

In the embodiments and modified forms described above, the depolarization unit 2 may be replaced by a polarization converting unit having a quarter waveplate, for example, for converting linearly polarized laser light into circularly polarized light or elliptically polarized light. On that occasion, the influence resulting from a change in the polarization state can be reduced, as compared with conventional structures.

In accordance with the embodiments of the present invention described hereinbefore, even if the polarization state of laser light from an exposure light source changes, the exposure amount control can be done more precisely, and the non-uniformness of illuminance or exposure can be reduced significantly.

While the invention has been described with reference to the structures disclosed herein, it is not confined to the details set forth and this application is intended to cover such modifications or changes as may come within the purposes of the improvements or the scope of the following claims.

What is claimed is:

1. An illumination system for lithography, comprising:

an optical system for projecting light from a laser onto a mask, said optical system including a plurality of optical integrators, including first and second optical integrators, wherein light beams from said first optical integrator are superposed one upon another on said second optical integrator and said optical system includes a birefringent element being effective to dissolve polarization of light from the laser, and being made of $CaF_2$, said birefringent element being disposed between the laser and said first optical integrator.

2. An illumination system according to claim 1, wherein said birefringent element is provided by distorting a member made of $CaF_2$.

3. An illumination system according to claim 2, wherein said birefringent element has a wedge-like shape.

4. An illumination system according to claim 1, wherein the laser comprises an $F_2$ laser.

5. An illumination system according to claim 3, wherein said optical system includes a pair of birefringent elements of wedge-like shape, which are disposed between said laser and said first optical integrator.

6. An exposure apparatus, comprising:

an optical system for projecting light from a laser onto a mask, said optical system including (i) a plurality of optical integrators, including first and second optical integrators, wherein light beams from said first optical integrator are superposed one upon another on said second optical integrator and (ii) a birefringent element being effective to dissolve polarization of light from the laser, and being made of $CaF_2$, said birefringent element being disposed between the laser and said first optical integrator; and a projection optical system for projecting a pattern of the illuminated mask, upon a substrate.

7. An apparatus according to claim 6, wherein said birefringent element is provided by distorting a member made of $CaF_2$.

8. An apparatus according to claim 7, wherein said birefringent element has a wedge-like shape.

9. An exposure apparatus according to claim 8, wherein said optical system includes a pair of birefringent elements of wedge-like shape, which are disposed between said laser and said first optical integrator.

10. An apparatus according to claim 6, wherein the laser comprises an $F_2$ laser.

11. A device manufacturing method, comprising the steps of:

exposing a wafer with a device pattern by use of an exposure apparatus as recited in claim 6; and developing the exposed wafer.

12. A method according to claim 11, further comprising providing the birefringent element by distorting a member made of $CaF_2$.

13. A method according to claim 12, wherein the birefringent element has a wedge-like shape.

14. A method according to claim 11, further comprising using an $F_2$ laser as the laser.

* * * * *

UNITED STATES PATENT AND TRADEMARK OFFICE
CERTIFICATE OF CORRECTION

PATENT NO. : 6,636,295 B2
DATED : October 21, 2003
INVENTOR(S) : Takahisa Shiozawa It is certified that error appears in the above-identified patent and that said Letters Patent is hereby corrected as shown below:

<u>Title page,</u>
Item [56], References Cited, U.S. PATENT DOCUMENTS, the last U.S. patent application publication listed, "2002/0114362 A1 * Volger et al. ……….372/32" should read -- 2002/0114362 A1 * Vogler et al. ……….372/32 --.

<u>Column 1,</u>
Line 22, "plane)." should read -- plane), --.
Line 62, "procedure." should read -- procedure, --.

<u>Column 2,</u>
Line 61, "in dependence" should read -- depending --.

<u>Column 5,</u>
Lines 51, 52 and 53, "is" should read -- be --.

<u>Column 6,</u>
Line 3, "in dependence" should read -- depending --.
Line 37, "so arranged" should read -- arranged so --.
Line 58, "non-uniformess" should read -- non-uniformness --.

<u>Column 7,</u>
Line 15, "$T2/T2S=(T1P \times R1S)/(T1S \times R1P)$" should read
-- $T2/T2S=(T1P \times R1S)/(T1S \times R1P)$. --

<u>Column 9,</u>
Line 17, "in dependence" should read -- depending --.
Line 67, "water" should read -- wafer --.

UNITED STATES PATENT AND TRADEMARK OFFICE
CERTIFICATE OF CORRECTION

PATENT NO. : 6,636,295 B2
DATED : October 21, 2003
INVENTOR(S) : Takahisa Shiozawa It is certified that error appears in the above-identified patent and that said Letters Patent is hereby corrected as shown below:

<u>Column 10,</u>
Line 9, "in dependence" should read -- depending --.

Signed and Sealed this

Thirteenth Day of April, 2004

JON W. DUDAS
*Acting Director of the United States Patent and Trademark Office*